US008975637B2

(12) United States Patent
Matsukizono et al.

(10) Patent No.: US 8,975,637 B2
(45) Date of Patent: Mar. 10, 2015

(54) SEMICONDUCTOR DEVICE, PROCESS FOR PRODUCTION OF THE SEMICONDUCTOR DEVICE, AND DISPLAY DEVICE EQUIPPED WITH THE SEMICONDUCTOR DEVICE

(75) Inventors: Hiroshi Matsukizono, Osaka (JP); Tomohiro Kimura, Osaka (JP); Hiroyuki Ogawa, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 100 days.

(21) Appl. No.: 13/500,023

(22) PCT Filed: Sep. 21, 2010

(86) PCT No.: PCT/JP2010/066287
§ 371 (c)(1),
(2), (4) Date: Apr. 3, 2012

(87) PCT Pub. No.: WO2011/043183
PCT Pub. Date: Apr. 14, 2011

(65) Prior Publication Data
US 2012/0193635 A1    Aug. 2, 2012

(30) Foreign Application Priority Data

Oct. 7, 2009   (JP) .................................. 2009-233255

(51) Int. Cl.
*H01L 27/14*         (2006.01)
*G02F 1/1362*        (2006.01)
(Continued)

(52) U.S. Cl.
CPC .......... *G02F 1/1362* (2013.01); *G02F 1/13318* (2013.01); *G02F 1/13338* (2013.01); *H01L 27/1214* (2013.01)
USPC ............. 257/72; 257/222; 257/225; 257/257; 257/290; 257/292; 438/66; 438/208; 438/356; 438/414

(58) Field of Classification Search
None
See application file for complete search history.

(56) References Cited

U.S. PATENT DOCUMENTS

2005/0045881 A1   3/2005 Nakamura et al.
2006/0017139 A1   1/2006 Eguchi et al.

FOREIGN PATENT DOCUMENTS

JP    5-275449    10/1993
JP    5-335332    12/1993
(Continued)

OTHER PUBLICATIONS

International Search Report mailed Oct. 26, 2010, directed to International Application No. PCT/JP2010/066287; 4 pages.
(Continued)

*Primary Examiner* — David Vu
*Assistant Examiner* — Cuong B Nguyen
(74) *Attorney, Agent, or Firm* — Morrison & Foerster LLP

(57) ABSTRACT

A thin film diode (100A) includes a semiconductor layer (130) having first, second, and third semiconductor regions, a first insulating layer (122) formed on the semiconductor layer (130), and a second insulating layer (123) formed on the first insulating layer (122). The first semiconductor region (134A) contains an impurity of a first-conductivity type at a first concentration; the second semiconductor region (135A) contains an impurity of a second-conductivity type different from the first conductivity type at a second concentration; and the third semiconductor region (133A) contains the first-conductivity type impurity at a third concentration lower than the first concentration, or contains the second-conductivity type impurity at a third concentration lower than the second concentration. The first semiconductor region (134A) conforms to an aperture pattern in the second insulating layer (123), or the second semiconductor region (135A) conforms to an aperture pattern in the second insulating layer (123).

20 Claims, 7 Drawing Sheets

(51) Int. Cl.
*G02F 1/133* (2006.01)
*G02F 1/1333* (2006.01)
*H01L 27/12* (2006.01)

(56) References Cited

FOREIGN PATENT DOCUMENTS

| | | |
|---|---|---|
| JP | 11-97703 | 4/1999 |
| JP | 2003-151994 | 5/2003 |
| JP | 2006-3857 | 1/2006 |
| JP | 2006-60191 | 3/2006 |
| JP | 2006-259241 | 9/2006 |
| JP | 2008-304830 | 12/2008 |
| JP | 2009-16855 | 1/2009 |

OTHER PUBLICATIONS

International Preliminary Report on Patentability mailed May 18, 2012, directed to International Application No. PCT/JP2010/066287; 9 pages.

(a)

(b)

(a)

(b)

(a)

(b)

(c)

(d)

(e)

(a)

(b)

(c)

(d)

(a)

(b)

SEMICONDUCTOR DEVICE, PROCESS FOR PRODUCTION OF THE SEMICONDUCTOR DEVICE, AND DISPLAY DEVICE EQUIPPED WITH THE SEMICONDUCTOR DEVICE

REFERENCE TO RELATED APPLICATION

This application is the national stage under 35 USC 371 of International Application No. PCT/JP2010/066287, filed Sep. 21, 2010, which claims priority from Japanese Patent Application No. 2009-233255, filed Oct. 7, 2009, the entire contents of which are incorporated herein by reference.

FIELD OF THE INVENTION

The present invention relates to a semiconductor device, a production method thereof, and a display device having a semiconductor device.

BACKGROUND OF THE INVENTION

In recent years, semiconductor devices having thin film transistors (TFTs) and thin film diodes (TFDs) formed on the same substrate, as well as electronic equipment having such a semiconductor device, are being developed (e.g., Patent Documents 1 and 2). Such a semiconductor device can be produced through forming semiconductor layers of the TFTs and TFDs by using the same crystalline semiconductor film that is formed on a substrate. The device characteristics of TFTs and TFDs that are formed on the same substrate are greatly affected by the structure of the semiconductor layers serving as their active regions.

Patent Document 1 discloses an image sensor having a photosensor portion utilizing a TFD and a driving circuit portion utilizing a TFT on the same substrate. Patent Document 1 discloses a display device which, by allowing a low concentration region (e.g., an n− or p− region) composing a photodiode in the photosensor to be larger than a high concentration region (e.g., an n+ or p+ region), provides an increased photocurrent, an improved efficiency of photoelectric conversion, and an improved S/N ratio (a current ratio of bright and dark). In the present specification, the p+ region and the n+ region may collectively be referred to as "high concentration regions". Moreover, the p− region (or n− region) may be referred to as a low concentration region (or an intrinsic region; i region).

Patent Literature

[Patent Document 1] Japanese Laid-Open Patent Publication No. 2006-3857
[Patent Document 2] Japanese Laid-Open Patent Publication No. 2009-16855

SUMMARY OF INVENTION

As display devices increase in resolution, it becomes necessary for the TFD provided in each pixel to become smaller. However, small TFDs make it difficult to obtain a sufficient photocurrent.

In the production method of a TFD disclosed in Patent Document 1, high concentration regions are formed by using usual photolithography steps, and misalignment must be taken into consideration; this results in a problem in that the high concentration regions will become longer than necessary, and that the low concentration region will decrease in length. A PIN (P-Intrinsic-N) diode has characteristics such that its photocurrent increases as the low concentration region increase in length. Moreover, recent liquid crystal display devices have pixels meant for higher resolution displaying, and the aforementioned problem becomes particularly outstanding in liquid crystal display devices having a high resolution.

Moreover, regarding the production of TFDs and TFTs, there is a problem in that insulation failures may occur due to insufficient coating of the insulating layers, thereby lowering the production yield.

The present invention has been made in view of the above problems, and a main objective thereof is to provide: a semiconductor device having a TFD and a TFT which provides a sufficient photocurrent even when downsized, and which is unlikely to experience insulation failures and has high reliability; a production method thereof; and a display device having such a semiconductor device.

A semiconductor device according to the present invention is a semiconductor device comprising an insulative substrate and a plurality of thin film diodes carried on the insulative substrate, wherein, each of the plurality of thin film diodes includes a semiconductor layer being formed on the insulative substrate and having first, second, and third semiconductor regions, a first insulating layer formed on the semiconductor layer, a second insulating layer formed on the first insulating layer, first and second contact holes penetrating through the first and second insulating layers, a first electrode being connected to the first semiconductor region within the first contact hole, and a second electrode being connected to the second semiconductor region within the second contact hole, the first semiconductor region containing an impurity of a first-conductivity type at a first concentration, the second semiconductor region containing an impurity of a second-conductivity type different from the first conductivity type at a second concentration, the third semiconductor region containing the first-conductivity type impurity at a third concentration lower than the first concentration or containing the second-conductivity type impurity at a third concentration lower than the second concentration; and the first semiconductor region conforms to an aperture pattern in the second insulating layer, or the second semiconductor region conforms to an aperture pattern in the second insulating layer.

In one embodiment, as viewed from a normal direction of the insulative substrate, an outer edge of the first semiconductor region is substantially defined by the aperture pattern in the second insulating layer, or an outer edge of the second semiconductor region is substantially defined by the aperture pattern in the second insulating layer.

In one embodiment, the first semiconductor region conforms to the aperture pattern in the second insulating layer, and the second semiconductor region conforms to the aperture pattern in the second insulating layer.

In one embodiment, as viewed from a normal direction of the insulative substrate, an outer edge of the first semiconductor region is substantially defined by the aperture pattern in the second insulating layer, and an outer edge of the second semiconductor region is substantially defined by the aperture pattern in the second insulating layer.

In one embodiment, the second insulating layer has a thickness greater than a thickness of the first insulating layer.

In one embodiment, the thickness of the second insulating layer is no less than 20 nm and no more than 200 nm.

In one embodiment, the thickness of the second insulating layer is no less than 30 nm and no more than 100 nm.

In one embodiment, the semiconductor device further comprises a plurality of thin film transistors carried on the insulative substrate.

A display device according to the present invention comprises any of the above semiconductor devices.

A production method of a semiconductor device according to the present invention is a production method of a semiconductor device having an insulative substrate and a plurality of thin film diodes carried on the insulative substrate, the production method comprising: step a of providing an insulative substrate; step b of forming a semiconductor layer on the insulative substrate; step c of forming a first insulating layer on the semiconductor layer and forming a second insulating layer on the first insulating layer; step d of forming first and second contact holes penetrating through the first and second insulating layers; step e of forming first, second, and third semiconductor regions by implanting impurities of first and second-conductivity types to the semiconductor layer, the first semiconductor region containing an impurity of a first-conductivity type at a first concentration, the second semiconductor region containing an impurity of a second-conductivity type different from the first conductivity type at a second concentration, the third semiconductor region containing the first-conductivity type impurity at a third concentration lower than the first concentration or containing the second-conductivity type impurity at a third concentration lower than the second concentration; and step f of forming on the second insulating layer a first electrode connected to the first semiconductor region within the first contact hole and a second electrode connected to the second semiconductor region within the second contact hole, wherein step e includes a step of forming the first semiconductor region in a self-aligning manner with respect to an aperture pattern in the second insulating layer, or a step of forming the second semiconductor region in a self-aligning manner with respect to an aperture pattern in the second insulating layer.

In one embodiment, step e includes a step of forming the first semiconductor region in a self-aligning manner with respect to an aperture pattern in the second insulating layer and a step of forming the second semiconductor region in a self-aligning manner with respect to an aperture pattern in the second insulating layer.

In one embodiment, at least one of step c and step d includes a dry etching step using hydrogen bromide.

Another semiconductor device according to the present invention is a semiconductor device comprising an insulative substrate and a plurality of thin film transistors carried on the insulative substrate, wherein, each of the plurality of thin film transistors includes a semiconductor layer being formed on the insulative substrate and having first, second, and third semiconductor regions, a first insulating layer formed on the semiconductor layer, a second insulating layer formed on the first insulating layer, a first electrode formed on the first insulating layer, first and second contact holes penetrating through the first and second insulating layers, a second electrode connected to the first semiconductor region within the first contact hole, and a third electrode connected to the second semiconductor region within the second contact hole, the first and second semiconductor regions containing an impurity of a first-conductivity type at a first concentration, the third semiconductor region containing the first-conductivity type impurity at a second concentration lower than the first concentration or containing an impurity of a second-conductivity type different from the first conductivity type at a third concentration lower than the first concentration; and the first semiconductor region conforms to an aperture pattern in the second insulating layer and the first electrode, or the second semiconductor region conforms to an aperture pattern in the second insulating layer and the first electrode.

In one embodiment, as viewed from a normal direction of the insulative substrate, an outer edge of the first semiconductor region is substantially defined by the aperture pattern in the second insulating layer and the first electrode, or an outer edge of the second semiconductor region is substantially defined by the aperture pattern in the second insulating layer and the first electrode.

In one embodiment, the first semiconductor region conforms to an aperture pattern in the second insulating layer and the first electrode, and the second semiconductor region conforms to an aperture pattern in the second insulating layer and the first electrode.

In one embodiment, as viewed from a normal direction of the insulative substrate, an outer edge of the first semiconductor region is substantially defined by the aperture pattern in the second insulating layer and the first electrode, and an outer edge of the second semiconductor region is substantially defined by the aperture pattern in the second insulating layer and the first electrode.

In one embodiment, the second insulating layer has a thickness greater than a thickness of the first insulating layer.

In one embodiment, the thickness of the second insulating layer is no less than 20 nm and no more than 200 nm.

In one embodiment, the thickness of the second insulating layer is no less than 30 nm and no more than 100 nm.

In one embodiment, a thickness of a gate insulating layer at an end portion of the semiconductor layer is greater than a thickness of the gate insulating layer in anywhere other than the end portion of the semiconductor layer.

In one embodiment, the semiconductor device further comprises a plurality of thin film diodes carried on the insulative substrate.

Another display device according to the present invention comprises any of the above semiconductor devices.

Another production method of a semiconductor device according to the present invention is a production method of a semiconductor device having an insulative substrate and a plurality of thin film transistors carried on the insulative substrate, the production method comprising: step a of providing an insulative substrate; step b of forming a semiconductor layer on the insulative substrate; step c of forming a first insulating layer on the semiconductor layer and forming a second insulating layer on the first insulating layer; step d of forming a first electrode on the first insulating layer; step e of forming first and second contact holes penetrating through the first and second insulating layers; step f of forming first and second semiconductor regions by implanting first and second-conductivity type impurities to the semiconductor layer, the first semiconductor region containing an impurity of a first-conductivity type at a first concentration, the second semiconductor region containing an impurity of a second-conductivity type different from the first conductivity type at a second concentration; and step g of forming on the second insulating layer an electrode connected to the first semiconductor region within the first contact hole, wherein step f includes a step of forming the first semiconductor region or the second semiconductor region in a self-aligning manner with respect to an aperture pattern in the second insulating layer and the first electrode.

In one embodiment, step f includes a step of forming the first semiconductor region in a self-aligning manner with respect to the aperture pattern in the second insulating layer and the first electrode, and a step of forming the second semiconductor region in a self-aligning manner with respect to the aperture pattern in the second insulating layer and the first electrode.

In one embodiment, at least one of step d and step e includes a dry etching step using hydrogen bromide.

According to the present invention, since the lengths of the high concentration regions can be minimized and the length of the low concentration region can be increased, a thin film diode can be provided which provides a sufficient photocurrent even in the case of disposing a PIN diode within the narrow pixel pitch of a higher resolution liquid crystal display device, and which experiences few insulation failures.

DETAILED DESCRIPTION OF THE INVENTION

Figure 1:
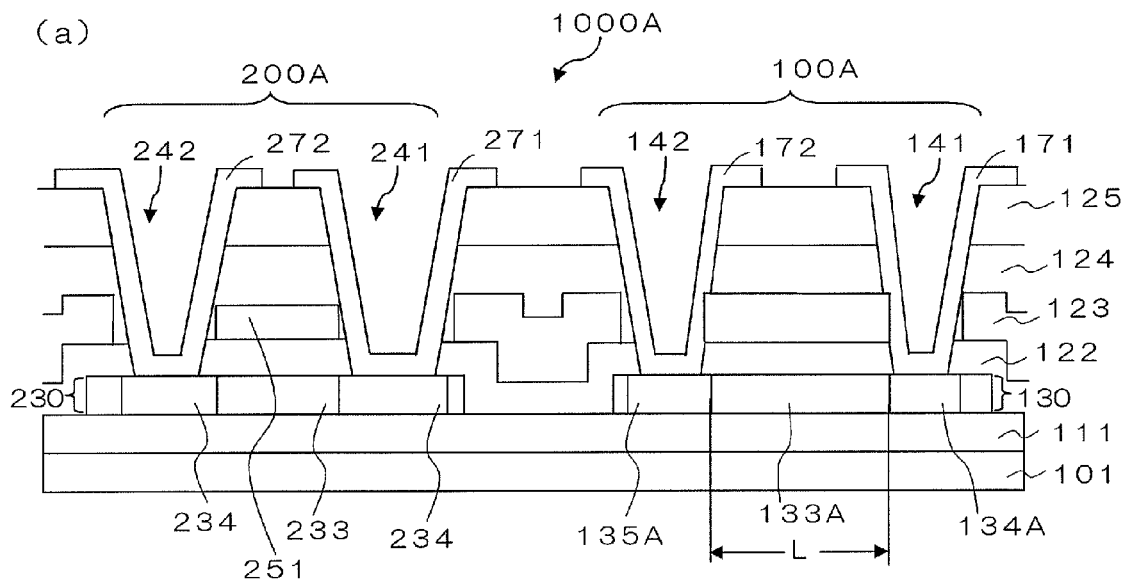
[FIG. 1] (a) is a schematic cross-sectional view of a thin film diode 100A and a thin film transistor 200A included in a semiconductor device 1000A according to an embodiment of the present invention; and (b) is a schematic plan view of the semiconductor device 1000A according to an embodiment of the present invention.
Figure 1:
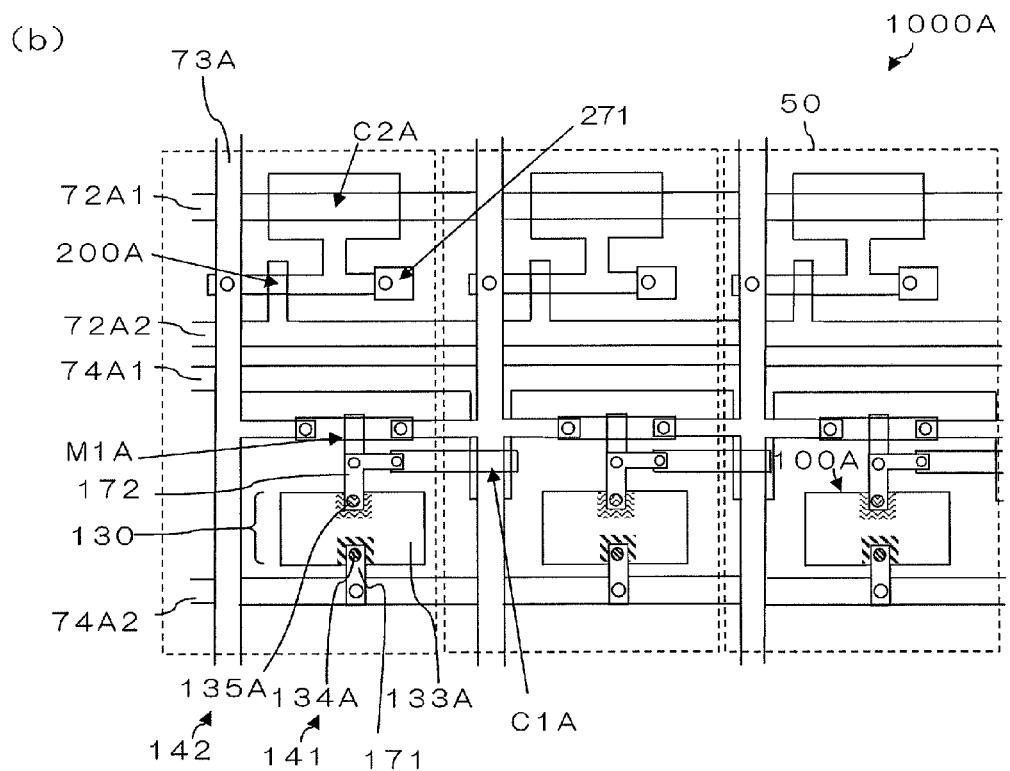
Figure 2:
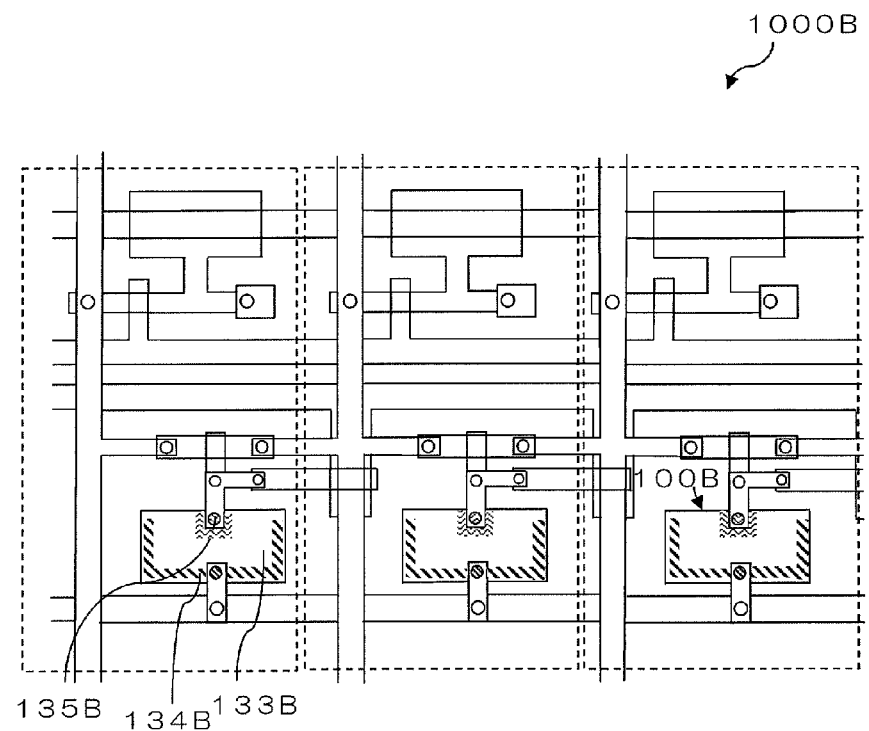
[FIG. 2] (a) is a schematic plan view of a semiconductor device 10008 according to an embodiment of the present invention; and (b) is a schematic plan view of a semiconductor device 1000C according to an embodiment of the present invention.
Figure 2:
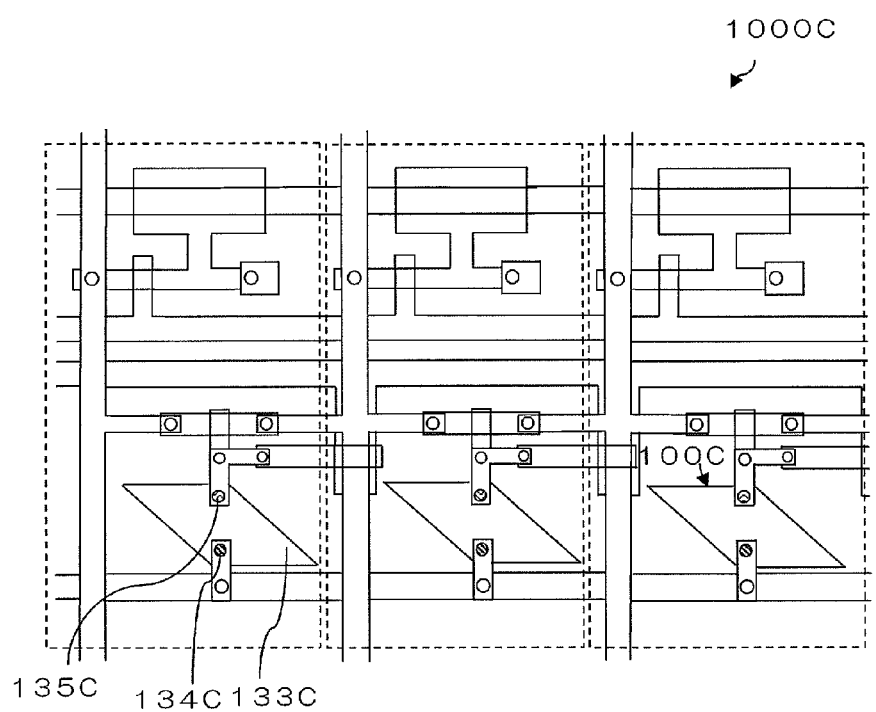

Hereinafter, with reference to the drawings, a semiconductor device according to an embodiment of the present invention and a production method thereof will be described. In the following, a TFT substrate having a thin film diode for each pixel, which is for use in a liquid crystal display device, will be illustrated as the semiconductor device; however, the present invention is not limited thereto.

With reference to FIG. 1 to FIG. 4, the structure of a semiconductor device 1000A according to an embodiment of the present invention and a production method thereof will be described.

FIGS. 1(a) and (b) show the structure of the semiconductor device 1000A according to an embodiment of the present invention. FIG. 1(a) is a schematic cross-sectional view showing the structure of a thin film diode 100A and a thin film transistor 200A included in the semiconductor device 1000A; and FIG. 1(b) is a schematic plan view of the semiconductor device 1000A.

The semiconductor device 1000A is a TFT substrate for use in a liquid crystal display device, having a thin film diode 100A and a thin film transistor 200A shown in FIG. 1(a) in each pixel 50. As shown in FIG. 1(b), the semiconductor device 1000A includes an insulative substrate not shown (e.g., a glass substrate) 101 and thin film diodes 100A and thin film transistors 200A carried on the insulative substrate 101. On the insulative substrate 101, Cs lines (storage capacitor lines) 72A1, gate bus lines 72A2, read signal lines (RWS) 74A1, and reset signal lines (RST) 74A2 extending along the row direction and source bus lines 73A extending along the column direction are formed in a lattice. The pixels 50 are arranged in a matrix array, such that a thin film diode 100A, a follower thin film transistor M1A, and a storage capacitor C1A are disposed for each pixel 50. Moreover, a thin film transistor 200A, a pixel capacitor C2A, and a pixel electrode are disposed for each pixel 50, the thin film transistor 200A being connected to a gate bus line 72A2 and a source bus line 73A. Semiconductor devices 1000B and 1000C described below have similar constructions.

As shown in FIG. 1(a), each thin film diode 100A includes: an overcoat layer 111 formed on the insulative substrate 101; a semiconductor layer 130 formed on the overcoat layer 111; and a first insulating layer 122, a second insulating layer 123, a third insulating layer 124, and a fourth insulating layer 125 formed on the semiconductor layer 130. The semiconductor layer 130 has a first semiconductor region 134A, a second semiconductor region 135A, and a third semiconductor region 133A. The second insulating layer 123 is thicker than the first insulating layer 122, and preferably has a thickness of no less than 20 nm and no more than 200 nm, and more preferably no less than 30 nm and no more than 100 nm.

Furthermore, the thin film diode 100A includes: a first contact hole 141 and a second contact hole 142 penetrating through the first insulating layer 122, the second insulating layer 123, the third insulating layer 124, and the fourth insulating layer 125; a first electrode 171 connected to the first semiconductor region 134A within the first contact hole 141; and a second electrode 172 connected to the second semiconductor region 135A within the second contact hole 142. The first electrode 171 and the second electrode 172 are formed on the insulating layer 125.

The first semiconductor region 134A contains an impurity of a first-conductivity type (e.g., a p type impurity) at a first concentration; the second semiconductor region 135A contains an impurity of a second-conductivity type (e.g., an n type impurity), which is different from the first conductivity type, at a second concentration; and the third semiconductor region 133A contains the first-conductivity type impurity at a third concentration lower than the first concentration, or contains the second-conductivity type impurity at a third concentration lower than the second concentration. That is, the first semiconductor region 134A is a p$^+$ region; the second semiconductor region 135A is an n$^+$ region; and the third semiconductor region 133A is a p$^-$ region or an n$^-$ region (i region).

In the thin film diode 100A, the first semiconductor region 134A and the second semiconductor region 135A conform to an aperture pattern (holes) in the second insulating layer 123. In other words, the two high concentration regions respectively conform to the corresponding aperture pattern in the second insulating layer 123. Herein, that a high concentration region "conforms to an aperture pattern in the second insulating layer" means that, through the production process of the thin film diode 100A, the high concentration region has been formed in a self-aligning manner with respect to the aperture pattern in the insulating layer. Therefore, the two-dimensional expanse of the high concentration region as viewed from the substrate normal direction is substantially defined by the aperture pattern in the insulating layer. Moreover, the aperture pattern in the insulating layer with respect to which the high concentration region is formed in a self-aligning manner is not limited to that in the second insulating layer 123, and between the two high concentration regions, at least one high concentration region may be formed so as to conform to the aperture pattern in the insulating layer. Furthermore, thin film diodes 100B and 100C of constructions as shown in FIG. 2(a) and FIG. 2(b) may also be used.

The thin film diodes 100B included in the semiconductor device 1000B shown in FIG. 2(a) have their second semiconductor region 135B conforming to an aperture pattern in the second insulating layer 123 not shown. First semiconductor regions 134B are formed by a known method such as photolithography.

Depending on the aperture pattern in the second insulating layer 123, as in the thin film diodes 100C included in the semiconductor device 1000C shown in FIG. 2(b), first semiconductor regions 134C and second semiconductor regions 135C can be made as small as possible.

Since the length L of the third semiconductor region 133A, 133B, or 133C is greater than those of the first semiconductor region 134A, 134B, or 134C and the second semiconductor region 135A, 135B, or 135C, a depletion layer which is formed between the first semiconductor region 134A, 134B, or 134C and the second semiconductor region 135A, 135B, or 135C has a broad expanse in the third semiconductor region 133A, 134B, or 134C, thus providing an advantage in that the photocurrent is increased and the efficiency of light/current conversion is improved. Moreover, since the length L of the third semiconductor region 133A, 133B, or 133C is defined by the aperture pattern in the second insulating layer 123, the length L does not vary, thereby providing an advantage in that characteristics variations in the thin film diode 100A, 100B, or 100C are reduced.

Figure 3:
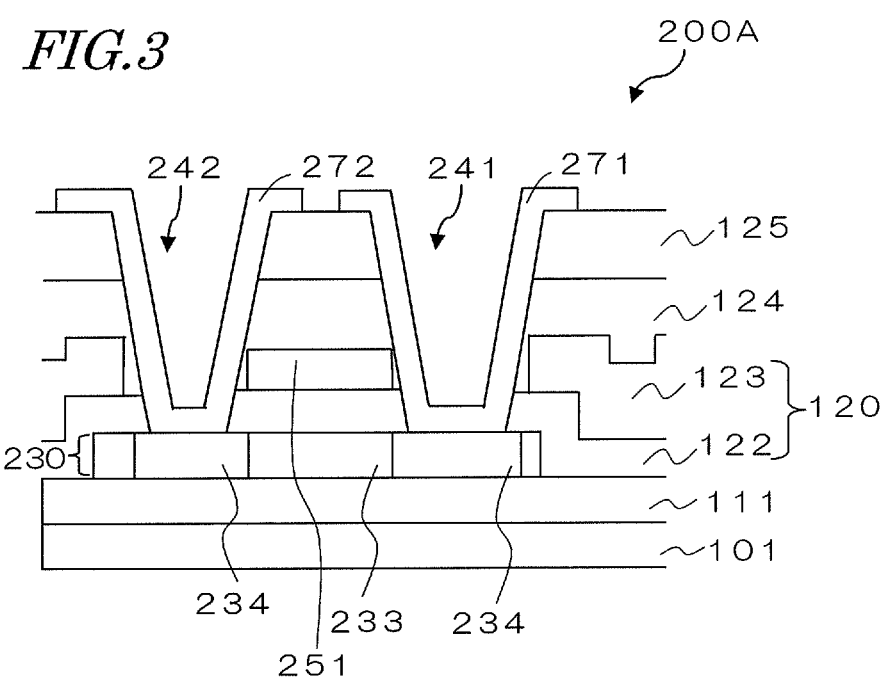
[FIG. 3] A schematic cross-sectional view of a thin film transistor 200A included in the semiconductor device 1000A according to an embodiment of the present invention.
Figure 4:
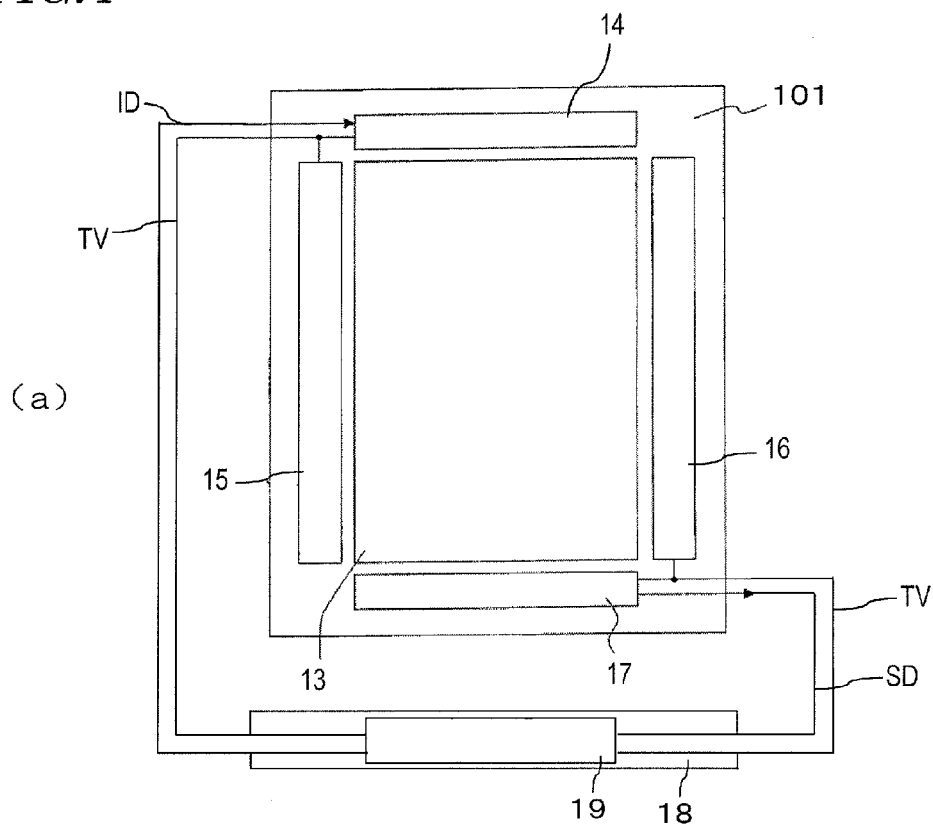
[FIG. 4] (a) is a schematic plan view showing the construction of a display device having the semiconductor device 1000A according to an embodiment of the present invention; and (b) is a circuit diagram showing a portion of a display region 13 in (a).
Figure 4:
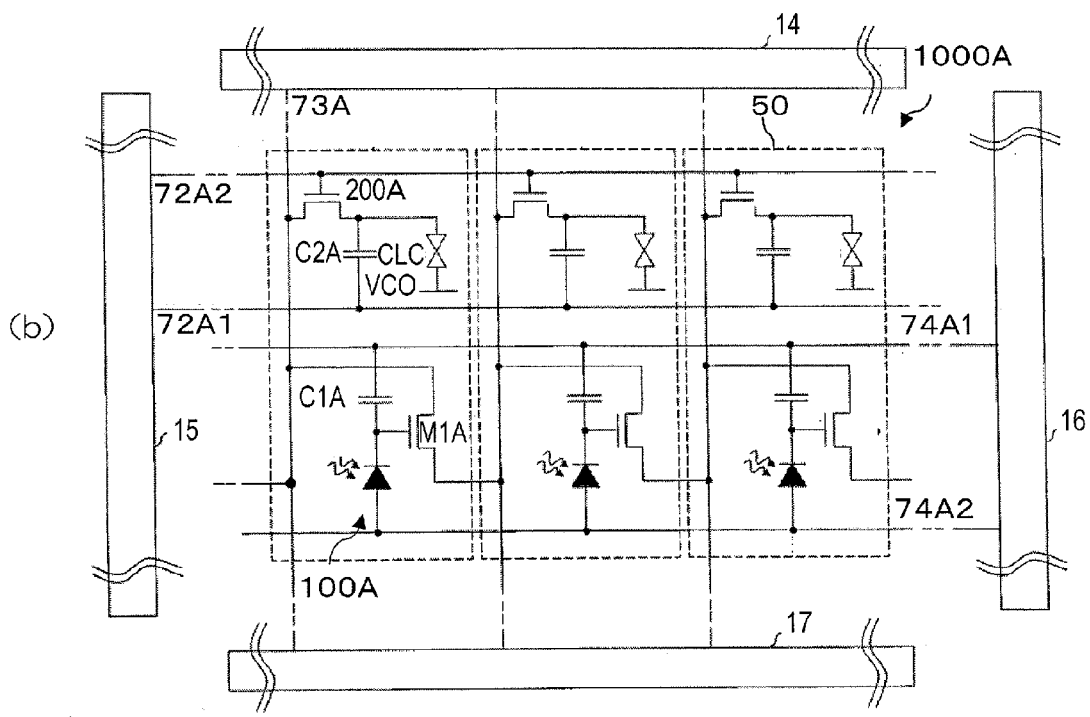

As shown in FIG. 1(a), each thin film transistor 200A includes: a semiconductor layer 230 formed on the insulative substrate 101; the first insulating layer 122, second insulating layer 123, third insulating layer 124, and fourth insulating layer 125 formed on the semiconductor layer 230; and a first electrode (gate electrode) 251 formed on the first insulating layer 122. The second insulating layer 123 is thicker than the first insulating layer 122, and preferably has a thickness of no less than 20 nm and no more than 200 nm, and more preferably no less than 30 nm and no more than 100 nm. The semiconductor layer 230 includes a first semiconductor region 234, a second semiconductor region 234, and a third semiconductor region 233. As shown in FIG. 3, at end portions of the semiconductor layer 230 of the thin film transistor 200A, the thickness of a gate insulating layer 120 having the first insulating layer 122 and the second insulating layer 123 is greater than that of the gate insulating layer 120 in anywhere other than the end portions of the semiconductor layer 230. Thus, by allowing the gate insulating layer at the end portions of the semiconductor layer to be thicker than the gate insulating layer in anywhere other than the end portions of the semiconductor layer, there is provided an advantage of preventing a decrease in production yield associated with insulation failures at the end portions of the semiconductor layer, which are likely to suffer insulation failures due to insufficient coating. Although the gate insulating layer 120 has a multi-layer structure in the present embodiment, the gate insulating layer 120 may have a single-layer structure.

Furthermore, the thin film transistor 200A includes: a first contact hole 241 and a second contact hole 242 penetrating through the first insulating layer 122, second insulating layer 123, third insulating layer 124, and fourth insulating layer 125; a second electrode 271 connected to the first semiconductor region 234 within the first contact hole 241; and a third electrode 272 connected to the second semiconductor region 234 within the second contact hole 242. The second electrode 271 and the third electrode 272 are formed on the fourth insulating layer 125.

The first semiconductor region 234 and the second semiconductor region 234 contain a first-conductivity type impurity (e.g., an n type impurity) at a first concentration; and the third semiconductor region 233 contains a second-conductivity type impurity different from the first-conductivity type impurity at a second concentration, or contains the first-conductivity type impurity at a third concentration lower than the first concentration. That is, the first semiconductor region 234 and the second semiconductor region 234 are n+ regions (or p+ regions), whereas the third semiconductor region 233 is a p− region or an n− region (channel region).

In the thin film transistor 200A, the first semiconductor region 234 and the second semiconductor region 234 conform to an aperture pattern (holes) that is defined by the second insulating layer 123 and the first electrode (gate electrode) 251. In other words, two high concentration regions respectively conform to the corresponding aperture pattern in the second insulating layer 123 and the first electrode 251. Herein, that a high concentration region "conforms to an aperture pattern in the second insulating layer and the first electrode" means that, through the production process of the thin film transistor 200A, the high concentration region has been formed in a self-aligning manner with respect to the aperture pattern in the insulating layer and the electrode. Therefore, the two-dimensional expanse of the high concentration region as viewed from the substrate normal direction is substantially defined by the aperture pattern in the insulating layer and the electrode. Moreover, between the two high concentration regions, at least one high concentration region may be formed so as to conform to the aperture pattern in the insulating layer and the electrode.

Next, FIG. 4(a) is a schematic plan view showing the construction of a display device having the semiconductor device 1000A. The display device shown in FIG. 4(a) has an image capturing function (image sensor), and is composed of the insulative substrate 101 and a semiconductor substrate 18. On the insulative substrate 101 are a display region 13 in which the gate bus lines 72A2 and the source bus lines 73A are formed, a source driver 14 for driving the source bus lines 73A, a gate driver 15 for driving the gate bus lines 72A2, a sensor read driver 17 for capturing and outputting an image, and a sensor scan driver 16 for driving the image sensor. A logic IC 19 for performing display control and image capturing control is provided on the semiconductor substrate 18. The logic IC 19 may be mounted on the insulative substrate 101, or externally connected to the insulative substrate 101 via an FPC, for example. Note that, in FIG. 4(a), TV denotes a timing control signal and a power voltage; SD denotes a sensor data signal; and ID denotes an image data signal.

FIG. 4(b) is a circuit diagram showing a portion of the display region 13. The display region 13 in FIG. 4(b) includes a thin film transistor 200A formed near each of intersections between the source bus lines 73A and gate bus lines 72A2 formed in columns and rows, a liquid crystal capacitor CLC and a pixel capacitor C2A connected between one end of the thin film transistor 200A and a Cs line 72A1, as well as the thin film diodes 100A, the follower thin film transistors M1A, and the storage capacitors C1A.

The operation principles of the image sensors will be briefly described.

First, a reset signal at a high level is supplied to a reset signal line (RST) 74A2. As a result, a forward bias is applied to a thin film diode 100A. At this time, since the potential of the gate electrode of the follower thin film transistor M1A is lower than a threshold voltage of the follower thin film transistor M1A, the follower thin film transistor M1A is in a non-conducting state.

Next, the potential of the reset signal line 74A2 is set to a low level. As a result, an integration period of photocurrent begins. In this integration period, a photocurrent which is in proportion to the amount of light entering the thin film diode 100A flows out, so that the storage capacitor C1A becomes discharged. In this integration period, too, the potential of the gate electrode of the follower thin film transistor M1A is lower than the threshold voltage of the follower thin film transistor M1A, so that the follower thin film transistor M1A remains in a non-conducting state.

Next, a read signal at a high level is supplied to the read signal line (RWS) 74A1. As a result, the integration period is ended, and a read period begins. As the read signal is supplied, charge is injected and stored in the storage capacitor C1A, and the potential of the gate electrode of the follower thin film transistor M1A becomes higher than the threshold voltage of the follower thin film transistor M1A. As a result, the follower thin film transistor M1A enters a conducting state, whereby an output voltage (VPIX) is read from the follower thin film transistor M1A via the source bus line 73A. VPIX is in proportion to an integral of the photocurrent in the thin film diode 100A during the integration period.

Next, the potential of the read signal line (RWS) 74A1 is lowered to a low level, thus ending the read period.

Figure 5:
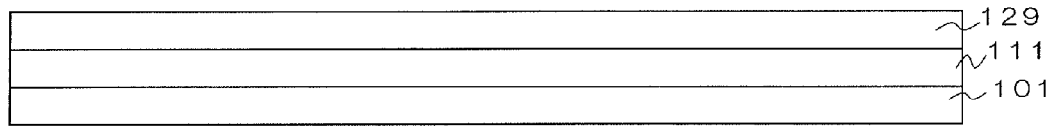
[FIG. 5] (a) to (e) are schematic cross-sectional views for describing a production method of a thin film diode 100A and a thin film transistor 200A according to an embodiment of the present invention.
Figure 5:
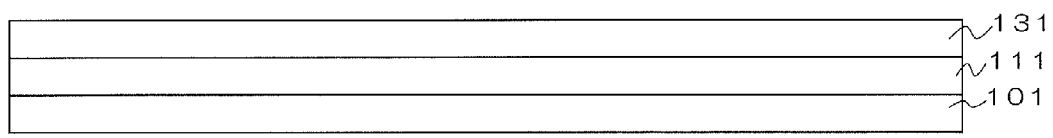
Figure 5:
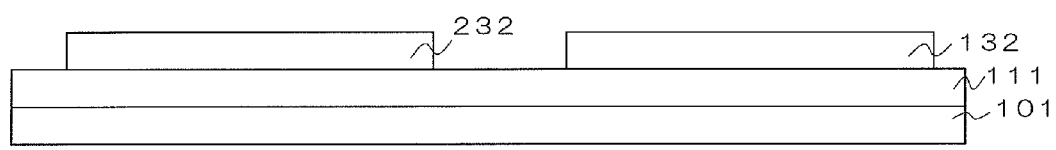
Figure 5:
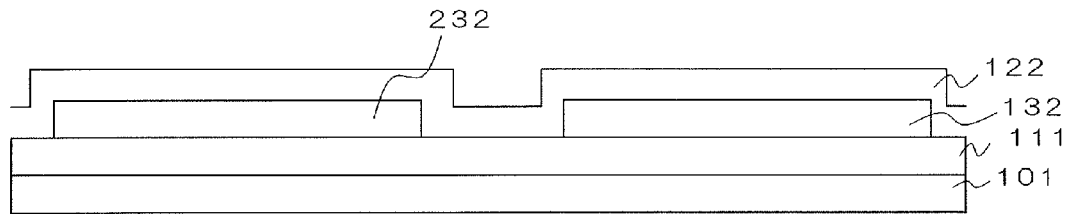
Figure 5:
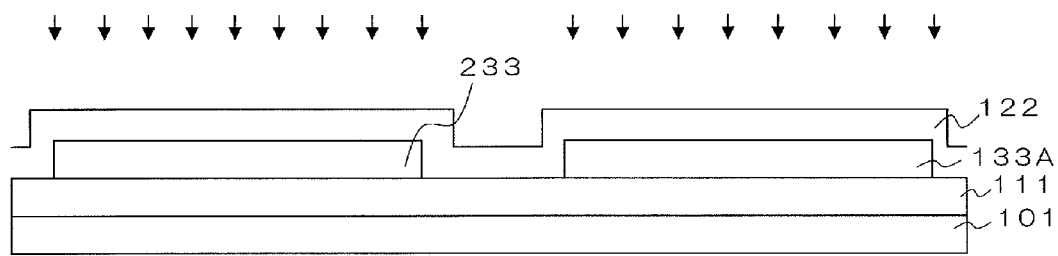
Figure 6:
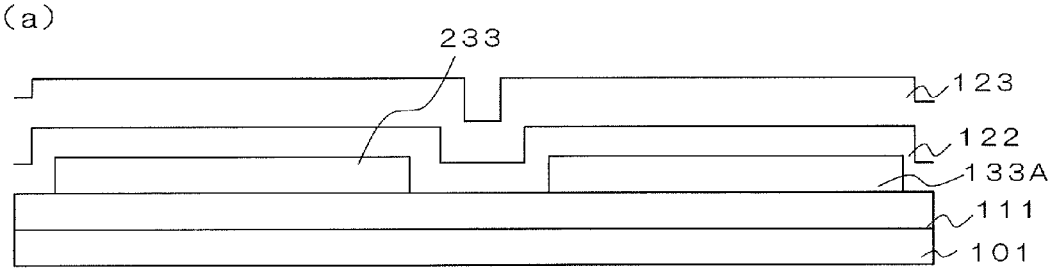
[FIG. 6] (a) to (d) are schematic cross-sectional views for describing a production method of a thin film diode 100A and a thin film transistor 200A according to an embodiment of the present invention.
Figure 6:
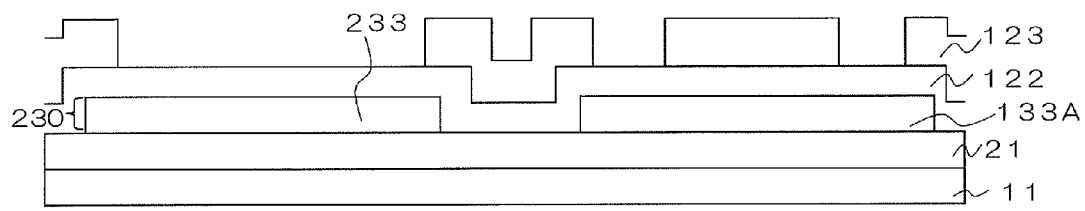
Figure 6:
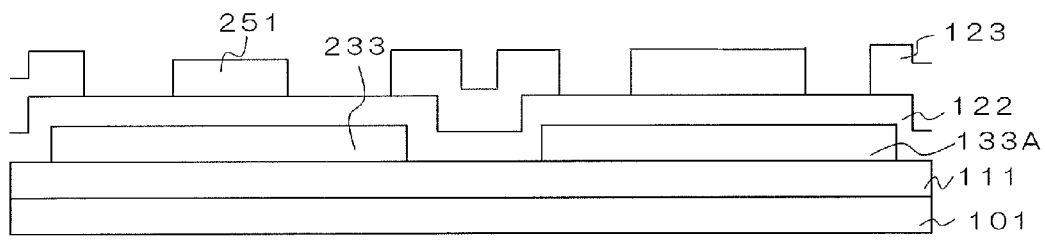
Figure 6:
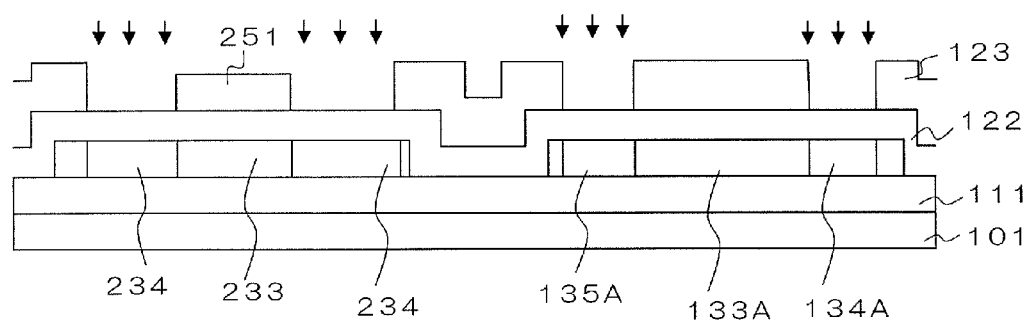
Figure 7:
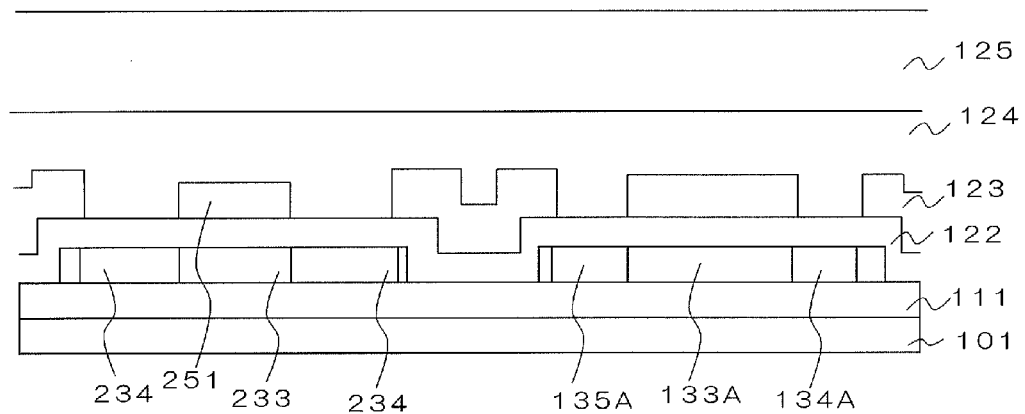
[FIG. 7] (a) and (b) are schematic cross-sectional views for describing a production method of a thin film diode 100A and a thin film transistor 200A according to an embodiment of the present invention.
Figure 7:
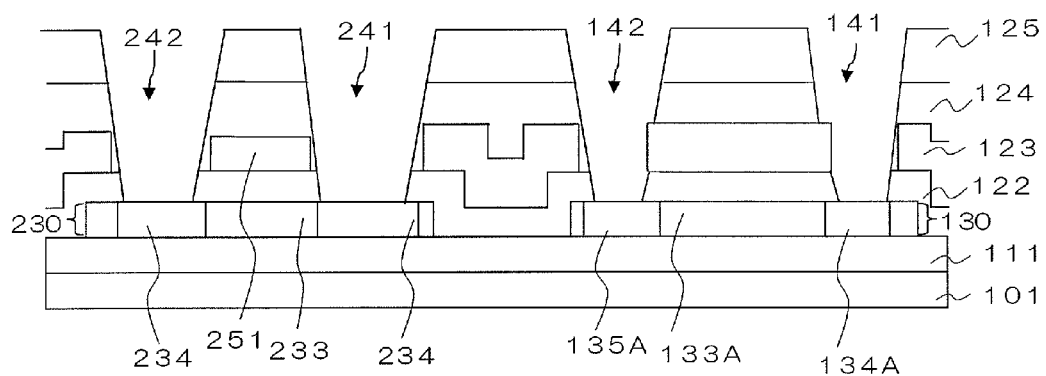

Next, with reference to FIG. 5 to FIG. 7, a production method of the semiconductor device 1000A will be described.

First, as shown in FIG. 5(a), a basecoat layer 111 containing e.g. $SiN_x$ (silicon nitride), $SiO_x$ (silicon oxide), or the like is formed on a glass substrate 101 by a CVD (Chemical Vapor Deposition) technique. Next, by a CVD technique, sputtering technique, or the like, an amorphous silicon (a-Si) layer 129 is formed on the basecoat layer 111.

Next, as shown in FIG. 5(b), the amorphous silicon layer 129 is subjected to a thermal annealing to dehydrate the amorphous silicon layer 129, and thereafter it is subjected to excimer laser irradiation, thus crystallizing the amorphous silicon layer 129 to form a polysilicon (p-Si) layer 131.

Next, as shown in FIG. 5(c), island shapes of polysilicon (p-Si) layers 132 and 232 are formed by photolithography or the like.

Next, as shown in FIG. 5(d), a first insulating layer 122 containing $SiO_x$ or the like is formed on the polysilicon layers 132 and 232 by a CVD technique or the like.

Next, as shown in FIG. 5(e), by using a photoresist not shown as a mask, a low concentration of p type impurity (e.g., boron (B) ions) is implanted to the polysilicon layers 132 and 232, thereby forming p− regions 133A and 233.

Next, as shown in FIG. 6(a), a second insulating layer 123, whose layer thickness is greater than the first insulating layer 122, is formed on the first insulating layer 122. The thickness of the second insulating layer 123 is preferably no less than 20 nm and no more than 200 nm, and more preferably no less than 30 nm and no more than 100 nm. The second insulating layer 123 contains $SiN_x$ and $SiO_x$, for example, and has a multilayer structure. Note that the first insulating layer 122 and second insulating layer (gate insulating layer) 123 formed in the thin film transistor 200A are made integral with the first insulating layer 122 and second insulating layer 123 formed in the thin film diode 100A. By forming the second insulating layer 123 so as to be thick, there is provided an advantage of preventing a decrease in the production yield due to insulation failures in the thin film transistor and the thin film diode.

Next, as shown in FIG. 6(b), the second insulating layer 123 excluding the end portions of the semiconductor layer 230 and the second insulating layer 123 over the regions to become the high concentration regions (the p+ region and n+ region) of the thin film diode 100A are etched away. When using dry etching to remove the second insulating layer 123 over the regions to become the high concentration regions (the p+ region and n+ region), it is preferable to use hydrogen bromide (HBr) as an etching gas, for example.

Next, as shown in FIG. 6(c), an electrode 251 (gate electrode) is formed on the first insulating layer 122. For example, in the case where dry etching is employed in forming the electrode 251, it is preferable to use hydrogen bromide (HBr) as the etching gas.

Next, as shown in FIG. 6(d), the region to become the p+region 134A is masked with a photoresist not shown, and by using the electrode 251 and the second insulating layer 123 as a mask, an n type impurity (e.g., phosphorus ions) are implanted to portions of the p− region (or n− region) 133A and 233, thereby forming the n+ regions 135A and 234. Next, the n+ regions 135A and 234 are masked by using a photoresist or the like not shown, and by using the second insulating layer 123 as a mask, a high concentration of p type impurity (e.g., boron ions) is implanted to a portion of the p− region (or n− region) 133A, thereby forming the p+ region 134A. Next, the substrate is heated to activate the impurity that has been implanted to the p− region 133A.

Next, as shown in FIG. 7(a), a third insulating layer 124 containing $SiN_x$ is formed on the second insulating layer 123 by a CVD technique or the like, and a fourth insulating layer 125 containing $SiO_x$ is formed on the third insulating layer 124 by a CVD technique or the like.

Next, as shown in FIG. 7(b), the semiconductor layers are hydrogenated through diffusion of hydrogen that is contained in the $SiN_x$ of the third insulating layer 124. Next, contact holes 141, 142, 241, and 242 for exposing the surface of the semiconductor layers 130 and 230 are formed by photolithography or the like. The etching of the contact holes employs conditions for obtaining a sufficient selection ratio between the second insulating layer 123 and the third insulating layer 124 containing $SiN_x$. In the case where dry etching is used to form the contact holes, it is preferable to use hydrogen bromide (HBr) as the etching gas.

Next, as shown in FIG. 1(a), by photolithography or the like, electrodes 271 and 272 for connecting to the n+ regions 234 within the respective contact holes 241 and 242, an electrode 171 for connecting to p+ region 134A within the contact hole 141, and an electrode 172 for connecting to the n+ region 135A within the contact hole 142 are formed. The electrodes 171, 172, 271, and 272 are formed upon the second insulating layer 123.

As described above, in the production method of the present embodiment, the p+ region 134A and the n+ region 135A included in the thin film diode 100A are formed in a self-aligning manner with respect to the aperture pattern in the second insulating layer 123. In other words, the p+ region 134A and the n+ region 135A are formed as a result of impurities (e.g., phosphorus ions or boron ions) being implanted into the aperture pattern of the second insulating layer 123, such that a desired semiconductor region (high concentration region) is formed in each impurity-implanted region. Although the impurities diffuse during the heat treatment (activation annealing) after the impurity implantation, it can be said that the final extent of the high concentration region is substantially defined by the aperture pattern in the second insulating layer 123.

Thus, since the high concentration regions are formed in a self-aligning manner with respect to the aperture pattern in the second insulating layer 123, the length of the p− region 133A in the finally-obtained thin film diode 100A will not vary, thus providing an advantage of reducing characteristics variations between one thin film diode and another. Since stray-light is restrained from entering the thin film diode and thus the optical S/N (Signal/Noise) ratio is increased, it is particularly effective when designing the p− region 133A so as to have a large length. Furthermore, since it is possible to make the p+ region 134A and the n+ region 135A smaller and make the length of the p− region 133A correspondingly larger, a greater photocurrent can be obtained; therefore, the higher resolution the display device has, the more advantage there is. Furthermore, since the length of the p− region 133A is defined by the aperture pattern in the second insulating layer 123, length variations do no occur, so that characteristics variations of the thin film diode can be reduced.

Since the high concentration regions (n+ regions or p+ regions) of the thin film transistor 200A are formed in a self-aligning manner with respect to the aperture pattern in the second insulating layer 123 and the first electrode 251, there is provided an advantage of being able to curtail the production Process and the production cost, as compared to forming high concentration regions in a conventional photolithography step.

Furthermore, by forming the second insulating layer 123 so as to be thick, insulation failures due to insufficient coating of the insulating layers are alleviated, thereby providing an advantage in that the thin film diode 100A and the thin film transistor 200A are improved in terms of reliability and production yield.

Although TFT-type liquid crystal display devices having a thin film diode for each pixel are illustrated as examples of the display device, the present invention is applicable to other display devices, such as organic EL display devices. Moreover, without being limited to display devices having a thin film diode for each pixel, it is applicable to display devices having an image sensor region separately from the display region, as is disclosed in Patent Document 2. It is certainly applicable to an image sensor itself, and to any electronic device, other than display devices, in which image sensors are integrated.

The present invention is applicable to a semiconductor device, a production method thereof, and a display device having a semiconductor device.

REFERENCE SIGNS LIST

72A1 Cs line
72A2 gate bus line
73A source bus line
74A1 read signal line (RWS)
74A2 reset signal line (RST)
M1A follower TFT
C1A storage capacitor
C2A pixel capacitor
101 insulative substrate
122 first insulating layer
123 second insulating layer
124 third insulating layer
130, 230 semiconductor layer
133A, 133B, 133C, 233 p− region
134A, 134B, 134C p+ region
135A, 135B, 135C, 234 n+ region
171, 172, 251, 271, 272 electrode

The invention claimed is:

1. A semiconductor device comprising an insulative substrate and a plurality of thin film diodes carried on the insulative substrate, wherein,
each of the plurality of thin film diodes includes
a semiconductor layer being formed on the insulative substrate and having first, second, and third semiconductor regions,
a first insulating layer formed on the semiconductor layer,
a second insulating layer formed on the first insulating layer,
a third insulating layer formed on the second insulating layer,
first and second contact holes penetrating through the first, second and third insulating layers,
first and second openings formed in the second insulating layer, the first opening of the second insulating layer corresponding to the first contact hole, and the second opening of the second insulating layer corresponding to the second contact hole;
a first electrode being connected to the first semiconductor region within the first contact hole, and
a second electrode being connected to the second semiconductor region within the second contact hole,
the first semiconductor region containing an impurity of a first-conductivity type at a first concentration, the second semiconductor region containing an impurity of a second-conductivity type different from the first conductivity type at a second concentration, the third semiconductor region containing the first-conductivity type impurity at a third concentration lower than the first concentration or containing the second-conductivity type impurity at a third concentration lower than the second concentration; and
the second insulating layer includes an insulating material different from an insulating material of the third insulating layer, at least a part of an inner surface of the first opening of the second insulating layer is covered with the third insulating layer and the first electrode, and at least a part of an inner surface of the second opening of the second insulating layer is covered with the third insulating layer and the second electrode; and
a sectional view of the semiconductor device satisfies at least one of: an outer edge of the first semiconductor region being aligned with an interface between the second and third insulating layers at the first opening; and an outer edge of the second semiconductor region being aligned with an interface between the second and third insulating layers at the second opening.

2. The semiconductor device of claim 1, wherein, in the sectional view, the outer edge of the first semiconductor region is aligned with the interface between the second and third insulating layers at the first opening, and the outer edge of the second semiconductor region is aligned with the interface between the second and third insulating layers at the second opening of the second insulating layer.

3. The semiconductor device of claim 1, wherein the second insulating layer has a thickness greater than a thickness of the first insulating layer.

4. The semiconductor device of claim 3, wherein the thickness of the second insulating layer is no less than 20 nm and no more than 200 nm.

5. The semiconductor device of claim 4, wherein the thickness of the second insulating layer is no less than 30 nm and no more than 100 nm.

6. The semiconductor device of claim 1, further comprising a plurality of thin film transistors carried on the insulative substrate.

7. A display device comprising the semiconductor device of claim 1.

8. A production method of the semiconductor device of claim 1, the production method comprising:
   step a of providing an insulative substrate;
   step b of forming a semiconductor layer on the insulative substrate;
   step c of forming a first insulating layer on the semiconductor layer and forming a second insulating layer on the first insulating layer, the second insulating layer having first and second openings by which the first insulating layer is exposed;
   step d of forming first and second semiconductor regions by implanting impurities of first and second-conductivity types to the semiconductor layer within the first and second openings of the second insulating layer, a region of the semiconductor layer which the impurities have not been implanted within the first or second openings of the second insulating layer being turned into a third semiconductor region, the first semiconductor region containing an impurity of a first-conductivity type at a first concentration, the second semiconductor region containing an impurity of a second-conductivity type different from the first conductivity type at a second concentration, the third semiconductor region containing the first-conductivity type impurity at a third concentration lower than the first concentration or containing the second-conductivity type impurity at a third concentration lower than the second concentration;
   step e of forming a third insulating layer on the second insulating layer and then forming first and second contact holes penetrating through the first, second and third insulating layers by forming openings in exposed regions of the first insulating layer, the exposed regions of the first insulating layer being exposed in the first and second openings of the second insulating layer respectively; and
   step f of forming on the second insulating layer a first electrode connected to the first semiconductor region within the first contact hole and a second electrode connected to the second semiconductor region within the second contact hole, wherein
   step d includes at least one of: a step of forming the first semiconductor region in a self-aligning manner with respect to the first opening of the second insulating layer, and a step of forming the second semiconductor region in a self-aligning manner with respect to the second opening of the second insulating layer.

9. The production method of a semiconductor device claim 8, wherein step d includes the step of forming the first semiconductor region in a self-aligning manner with respect to the first opening of the second insulating layer and the step of forming the second semiconductor region in a self-aligning manner with respect to the second opening of the second insulating layer.

10. The production method of a semiconductor device of claim 8, wherein step c includes a dry etching step using hydrogen bromide to etch the second insulating layer.

11. A semiconductor device comprising an insulative substrate and a plurality of thin film transistors carried on the insulative substrate, wherein,
   each of the plurality of thin film transistors includes
      a semiconductor layer being formed on the insulative substrate and having first, second, and third semiconductor regions,
      a first insulating layer formed on the semiconductor layer,
      a second insulating layer formed on the first insulating layer, the second insulating layer having an opening by which the first insulating layer is exposed,
      a third insulating layer formed on the second insulating layer,
      a first electrode formed on the first insulating layer in the opening of the second insulating layer,
      first and second contact holes penetrating through the first, second and third insulating layers in the opening of the second insulating layer;
      a second electrode connected to the first semiconductor region within the first contact hole, and
      a third electrode connected to the second semiconductor region within the second contact hole,
      the first and second semiconductor regions containing an impurity of a first-conductivity type at a first concentration, the third semiconductor region containing the first-conductivity type impurity at a second concentration lower than the first concentration or containing an impurity of a second-conductivity type different from the first conductivity type at a third concentration lower than the first concentration;
      the second insulating layer includes an insulating material different from an insulating material of the third insulating layer, at least a part of an inner surface of the opening of the second insulating layer is covered with the third insulating layer; and
      a sectional view of the semiconductor device satisfies at least one of: (a) a part of an outer edge of the first semiconductor region is aligned with an interface between the second and third insulating layers at the opening of the second insulating layer, and (b) a part of an outer edge of the second semiconductor region is aligned with an interface between the second and third insulating layers at the opening of the second insulating layer.

12. The semiconductor device of claim 11, in the sectional view, (a) the part of the outer edge of the first semiconductor region is aligned with the interface between the second and third insulating layers at the opening of the second insulating layer, and (b) the part of an outer edge of the second semiconductor region is aligned with the interface between the second and third insulating layers at the opening of the second insulating layer.

13. The semiconductor device of claim 11, wherein the second insulating layer has a thickness greater than a thickness of the first insulating layer.

14. The semiconductor device of claim 13, wherein the thickness of the second insulating layer is no less than 20 nm and no more than 200 nm.

15. The semiconductor device of claim 14, wherein the thickness of the second insulating layer is no less than 30 nm and no more than 100 nm.

16. The semiconductor device of claim 11, further comprising a plurality of thin film diodes carried on the insulative substrate.

17. A display device comprising the semiconductor device of claim 11.

18. A production method of the semiconductor device of claim 11, the production method comprising:

step a of providing an insulative substrate;

step b of forming a semiconductor layer on the insulative substrate;

step c of forming a first insulating layer on the semiconductor layer and forming a second insulating layer on the first insulating layer, the second insulating layer having an opening by which the first insulating layer is exposed;

step d of forming a first electrode on the first insulating layer in the opening of the second insulating layer;

step e of forming first and second semiconductor regions by implanting first conductivity type impurity to the semiconductor layer within the opening of the second insulating layer, a region of the semiconductor layer which the first-conductivity type impurity has not been implanted within the opening of the second insulating layer being turned into a third semiconductor region, the first and second semiconductor regions containing the first-conductivity type impurity at a first concentration, the third semiconductor region containing the first-conductivity type impurity at a second concentration lower than the first concentration or containing an impurity of a second-conductivity type different from the first conductivity type at a third concentration lower than the first concentration;

step f of forming a third insulating layer on the second insulating layer and then forming first and second contact holes penetrating through the first, second and third insulating layers to the first and second semiconductor regions respectively by forming first and second openings in exposed regions of the first insulating layer, the exposed regions of the first insulating layer being exposed in the opening of the second insulating layer and not covered with the first electrode; and step g of forming on the second insulating layer an electrode connected to the first semiconductor region within the first contact hole, wherein step e includes step h of forming at least one of the first semiconductor region and the second semiconductor region in a self-aligning manner by using the second insulating layer and the first electrode as implanting masks.

19. The production method of a semiconductor device of claim 18, wherein, in the step h the first semiconductor region and the second semiconductor region are formed in a self-aligning manner by using the second insulating layer and the first electrode as implanting masks.

20. The production method of a semiconductor device of claim 18, wherein step c includes a dry etching step using hydrogen bromide to etch the second insulating layer.

* * * * *